United States Patent [19]

Kundu

[11] Patent Number: 5,796,751
[45] Date of Patent: Aug. 18, 1998

[54] TECHNIQUE FOR SORTING HIGH FREQUENCY INTEGRATED CIRCUITS

[75] Inventor: Sandip Kundu, Austin, Tex.

[73] Assignee: International Business Machines Corporation, Armonk, N.Y.

[21] Appl. No.: 684,751

[22] Filed: Jul. 22, 1996

[51] Int. Cl.[6] .......................... G01R 31/00; H04B 17/00
[52] U.S. Cl. .............................. 371/22.3; 371/28
[58] Field of Search .................. 371/22.3, 22.2, 371/22.1, 22.5, 22.6, 27, 28, 61; 324/158 R; 365/201, 189.12

[56] References Cited

U.S. PATENT DOCUMENTS

| | | | |
|---|---|---|---|
| 4,058,767 | 11/1977 | Muehldorf et al. | 324/73 |
| 5,039,939 | 8/1991 | Dizk et al. | 324/158 R |
| 5,206,861 | 4/1993 | Hannon et al. | 371/22.3 |
| 5,286,656 | 2/1994 | Keown et al. | 437/7 |
| 5,341,096 | 8/1994 | Yamamura | 324/765 |
| 5,355,369 | 10/1994 | Greenbergerl et al. | 371/22.3 |
| 5,428,626 | 6/1995 | Frisch et al. | 371/27 |
| 5,469,445 | 11/1995 | Nicolaidis | 371/22.3 |

*Primary Examiner*—Hoa T. Nguyen
*Attorney, Agent, or Firm*—Mark E. McBurney

[57] ABSTRACT

A system and method is providing for sorting integrated circuits based upon their maximum operating frequency. More particularly, the incremental time required for a test signal to be flushed through a level sensitive scan design (LSSD) circuit is measured. The test method of the present invention measures scan flush delay in the integrated circuit in order to measure the frequency of the circuit. A free running reference clock and on-chip counter are used measure the flush delay time period. With this information a count/second parameter can be determined, indicating the speed at which the test bit is flushed through the scan chain. The lower the value of the parameter, the higher the operating frequency of the chip.

12 Claims, 2 Drawing Sheets

TECHNIQUE FOR SORTING HIGH FREQUENCY INTEGRATED CIRCUITS

BACKGROUND OF THE INVENTION

The present invention generally relates to testing integrated circuits for process variations in the chips which may occur during fabrication and cause discrepancies in the chip frequency. More particularly, the integrated circuits are sorted based upon their maximum operating frequency.

It is known to sort, or categorize, integrated circuits into different classes based upon their frequency such that higher prices can be charged for faster chips while lower frequency parts demand lower prices. Typical testing apparatus apply various test patterns from an external system environment to the integrated circuit being tested using successive trial and error procedures. In particular, a specific microprocessor may be installed in a system board with a variable clock also included thereon. The frequency of the microprocessor chip is then increased until the chip fails. The frequency at which the chip failed is known and it can then be sorted into a particular category based upon operating frequency. This is an extremely expensive testing method, because the test apparatus (system board) must be clocked at frequencies exceeding the expected frequency of the integrated circuit being fabricated. For example, if the expected frequency of the IC is 100 megahertz, then the test apparatus would need to be designed to operate at speeds approaching 150 megahertz, in order to test the integrated circuits being fabricated. Those skilled in the art will understand the difficulty in designing a test apparatus at speeds exceeding the IC being manufactured, since the IC will likely be a state of the art design in and of itself.

It is well known that the integrated circuit fabrication process is imprecise for every transistor fabricated. For example, transistors fabricated on a particular chip may have conducting channels of a greater length than transistors on a subsequent chip, with both chips being on the same wafer. Therefore, the transistor having shorter channel length may run at speeds faster than the transistors having a longer channel. Further, these variations may also occur on transistors included on the same chip within a wafer. Thus, it has been the practice of integrated circuit manufacturers to sort the various chips based upon their frequency and price them accordingly. It has been a relatively simple task to test chips operating at lower frequencies, such as 33, 66 and even 100 megahertz since test apparatus of the same or greater frequency is readily available or easily fabricated. However, testing very high frequency chips becomes increasingly difficult as these chips approach frequencies greater than 250 megahertz. This is due to the fact that a test apparatus including a system board with a clock that can be varied to frequencies in excess of the expected chip speed are very costly to obtain and/or build. Further, even if a test apparatus could be built, it is difficult to apply the test pattern from the tester to the chip through cables, pins, connectors and the like without compromising the frequency of the test pattern or the noise immunity of the chip.

It can be seen that when the cost of sorting integrated circuits exceeds the amount of incremental value which can be obtained from the sale of high frequency chips, then it is not financially feasible to perform sorting at all. Therefore, it can be seen that a low cost efficient method of sorting integrated circuits based on their maximum operating frequency is needed and desirable.

SUMMARY OF THE INVENTION

In contrast to the prior art, the present invention provides a low cost, efficient and accurate method of sorting integrated circuits based upon their maximum operating frequency. More particularly, the present invention measures the incremental time required for a test signal to be flushed through a level sensitive scan design (LSSD) circuit. That is, the test method of the present invention measures scan flush delay in the integrated circuit in order to measure the frequency of the circuit. The present invention is utilized on chips where the scan chain is flushable, i.e. all LSSD designs are scan flushable. A further element of the present invention is an on-chip counter and a free running reference clock which can be used to measure the flush delay time period.

Broadly, the invention requires a binary counter which is clocked by the free running reference clock. This counter works similar to a stop watch. The scan chain of the integrated circuit being tested is then set up in the flush mode. The input is toggled and the counter is started from a reset mode and when the scan output change is noticed, the counter is stopped and the content of the counter is read out by a tester. It will be understood that for a faster chip the counter will advance fewer times than with a slower chip.

The present invention allows testing to occur for a high frequency chip without the need for a clock which runs at speeds in excess of the chip being tested. That is, the free running clock is utilized to measure the incremental counts of the counter and can run at a slower speed than the chip under test. More particularly, the free running clock provides a level of detail or granularity for the counter, i.e. how long is the time period for each count to incrementally advance. Additionally, the counter and a chip test controller circuit are included on the integrated circuit such that each of these components will be subject to the same external characteristics such as heat, and the like. Therefore, many of the additional cables, connectors and the like used by conventional testers are not required by the present invention.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
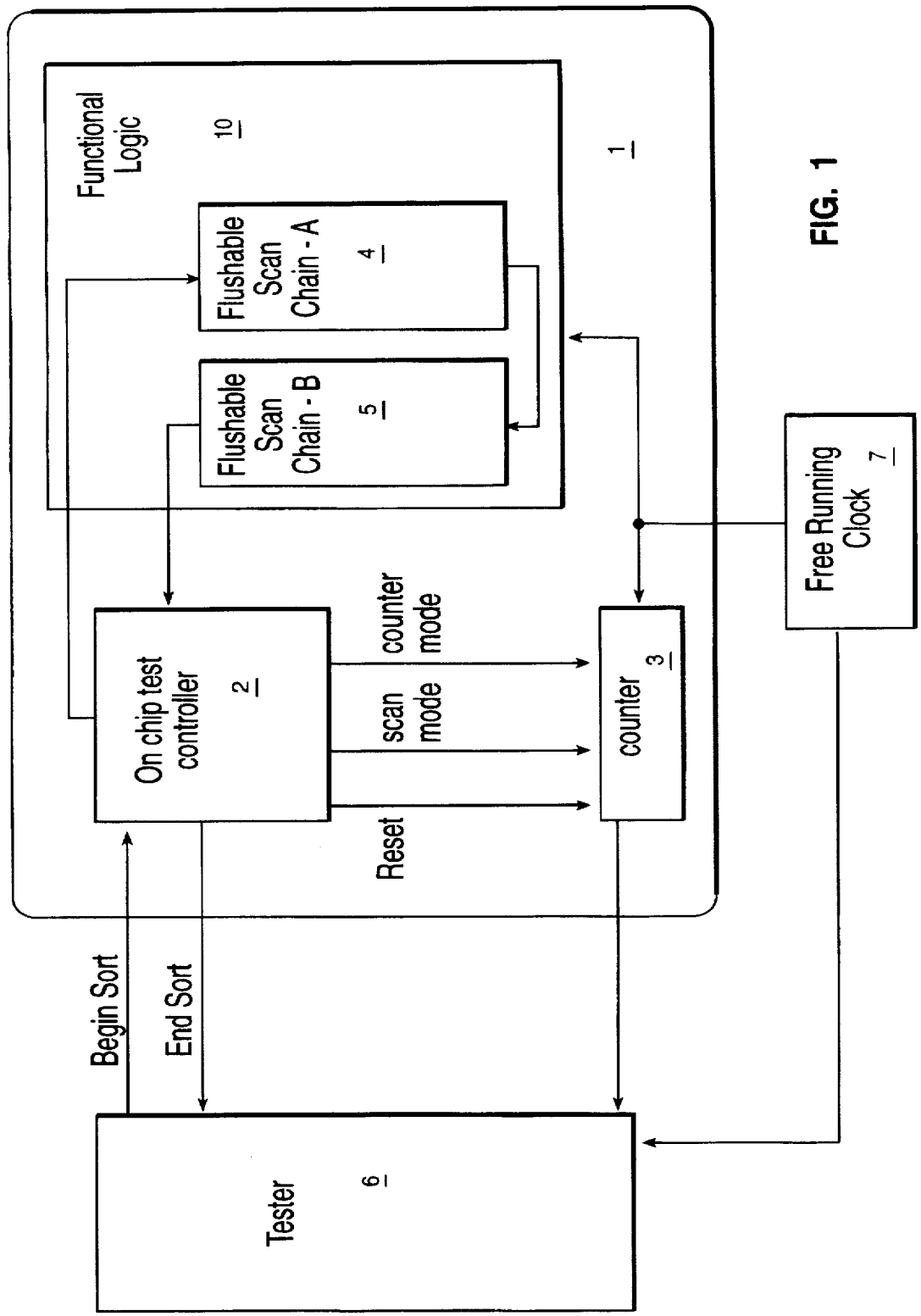
FIG. 1 is a block diagram showing the components of the present invention which are to be included on an integrated circuit capable of being tested with the flush scan technique.

Referring to FIG. 1, a block diagram illustrating a preferred embodiment of the present invention is shown and will now be described. An integrated circuit, or chip 1 is shown which may be one of any number of integrated circuits including microprocessors, application specific integrated circuit (ASIC), microcontrollers or the like. Integrated circuit 1 includes functional logic 10 which performs the various operations for which the chip is designed. This functional logic also includes a level sensitive scan design circuit with a scan flush delay feature (i.e. flushable scan chains 4, 5). In one preferred embodiment, integrated circuit 1 of FIG. 1 is shown as a diced chip, rather than a chip still included in an undiced wafer, although undiced chips can also be sorted using the present invention. Each integrated circuit implementing the present invention will include an on-chip test controller 2 with outputs external to the chip for connection to a tester 6. The first flushable scan chain 4 is shown connected sequentially with on-chip test controller 2 and a second flushable scan chain 5. The input to scan chain 4 is received from controller 2, and the output of scan chain 5 is provided to controller 2. It should be noted that the present invention contemplates any number of flushable scan chains 4 and 5, however, two such chains are shown in FIG. 1 to simplify the description of the present invention. A counter 3 is also included on integrated circuit 1 and is interconnected with chip test controller 2 in order to receive the various control signals from the controller. A free running clock 7 is also provided and interconnected with tester 6. In a preferred embodiment, free running clock 7 is provided external to chip 1, but this clock could also be included on the chip itself, in accordance with a specific chip design. In addition to its use by the present invention, the output of free running clock 7 is also utilized by functional logic 10 for various testing and scanning applications.

Figure 2:
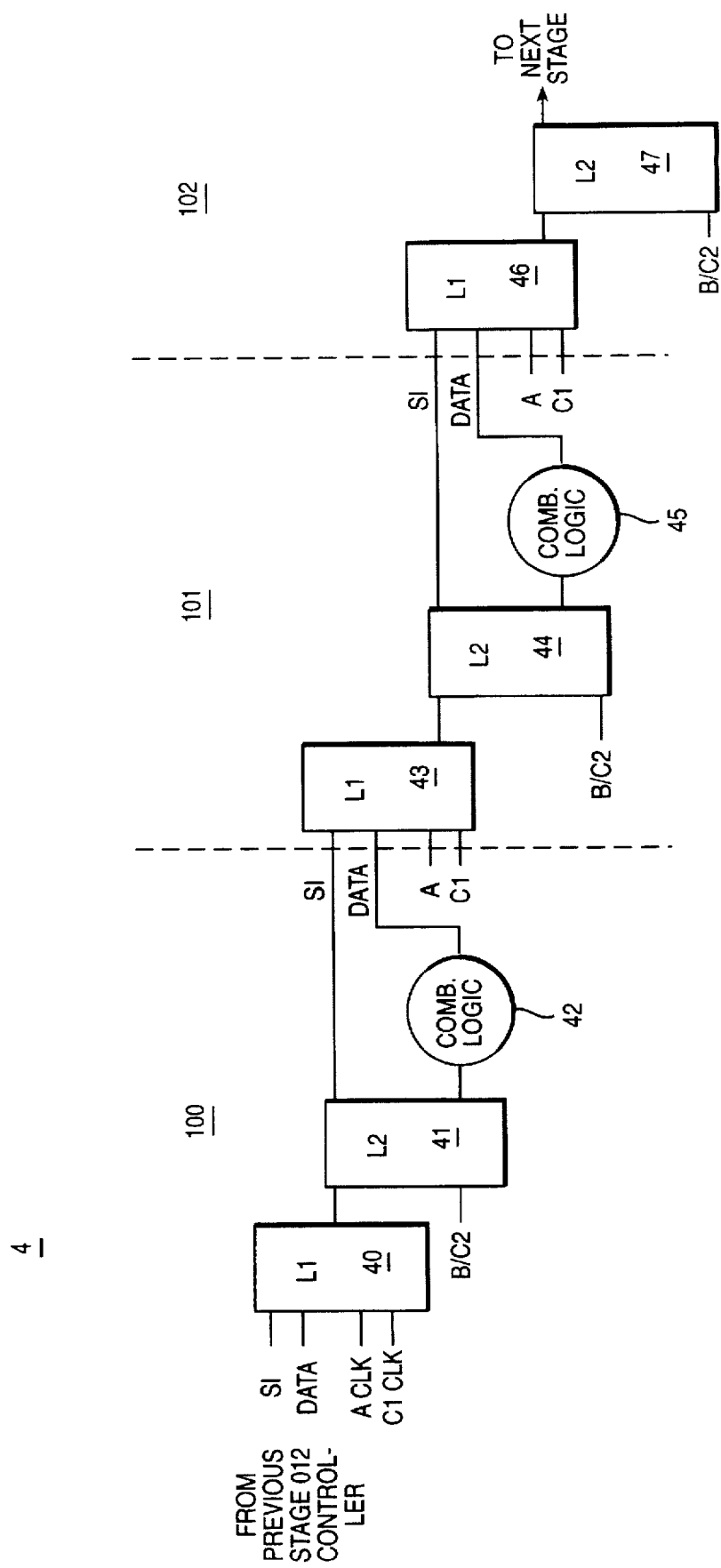
FIG. 2 is a flushable scan chain included in integrated circuits capable of being tested by the present invention.

FIG. 2 shows a subset of the stages included in a flushable scan chain such as chains 4 and 5 of FIG. 1. Each representative stage 100, 101, 102 and the like in the flushable scan chain includes a first latch 40, 43 and 46 which receives four inputs. The first two inputs are the scan input (SI) and the data input, respectively. Additionally, two clock inputs are also provided to latch L1, i.e. a clock signal designated as "A" and another shown as "C1". The output of latches 40, 43 and 46 is provided to a second latch L2, 41, 44 and 47 provided in each stage. Latch L2 receives the output from the corresponding L1 latch in addition to one of two independent clock inputs "B" or "C2". The output of L2 latches 41, 44 and 47 are provided to the L1 latch of the subsequent stage as the scan input or to combinational logic 42 and 45, which are specific logical circuits included in functional logic 5 as the data input from a previous stage. It can be seen how the scan chains 4 and 5 have the ability to sequentially transfer, or flush, binary data between the various interconnected stages in the chain.

Combinational logic 42 and 45 provides the function for integrated circuit 1. For example, if chip 1 is a microprocessor, then the combinational logic will provide functions associated with data processing. Similarly, if integrated circuit 1 is an I/O controller, then the combinational logic may provide the various handshaking protocols required for chip to chip communication. In a preferred embodiment, integrated circuit 1 will be one of the PowerPC microprocessors which are commercially available from IBM Corporation (PowerPC is a trademark of the IBM Corporation).

The operation of the present invention will now be described with reference to FIGS. 1 and 2. Again, it is noted that one aspect of the utility of the present invention lies in being able to sort integrated circuits 1 based on their maximum operating frequency. Briefly, counter 3 is reset and controller 2 toggles the input to scan chain 4 by inputting a test bit. When the controller 2 receives the toggled bit, the counter is stopped and its value sent to tester .6 for comparison with free running clock 7. Counter 3 can be thought of as counting events, such as a number of gates in the scan chain. Although, the number of counts present in counter 3 will not necessarily correspond to the actual number of gates in the scan chain it will provide a count value which can be used in conjunction with the time period from the free running clock to determine an event (or count) per time period parameter.

Initially, the size of counter 3 must be determined. As an example, if scan chain 4 includes 1024 stages with two latches per stage, there will be 2048 total gates for this scan chain. For the sake of simplicity, assume that scan chain 5 also includes 1024 stages and will have 2048 total gates, since each stage includes latches L1 and L2. Thus, there will be 4096 total gates in the series connected scan chains 4 and 5. Of course, the existence of additional scan chains, or additional latches per stage, would make this number vary. Each particular integrated circuit design will have a known gate delay, for example 0.1 nanoseconds per gate. Thus, it is expected that it will take 409.6 nanoseconds for a signal to traverse through scan chains 4 and 5. If the period of free running clock 7 is 1 nanosecond, a counter with the ability to count up to at least 512 is required. However, since fabrication inconsistencies may occur at each gate, the capacity of counter 3 should be increased by a factor of 2. Therefore, in this example, counter 3 would be sized as a 10 bit (1024) binary counter. Thus, chips 1 which exceed the anticipated maximum operating frequency can be handled by counter 3.

Chip 1 is interconnected to tester 6 through various interconnection means, such as a bread-board and appropriate cabling. Tester 6 issues a begin sort signal to controller 2. The reset signal from controller 2 is utilized to place the counter value at 0. The scan mode signal enables the scan clock C1 and C2 for latches in the counter (the counter itself is scannable). When controller 2 selects counter mode, it enables the free running clock 7 which is applied as a functional clock for counter 3. Those skilled in the art will understand that transient signals may be present during the time when the flushable scan chains 4 and 5 are initially enabled. Therefore, the present invention provides a delay to allow these transients to settle out prior to running the sorting test. That is, at power on the counter 3 is reset and then enabled such that it counts up to its maximum value (in this example 1024) such that integrated circuit 1 can stabilize. Then, when the begin sort signal is received from tester .6, the counter is again reset and started (counter mode is enabled) and the reference scan chain clocks are set up for flush (clocks C1 and C2 are both on) and the input from controller 2 to flushable scan chains 4 and 5 is set to a definite value. At this time, controller 2 has toggled the input to scan chain 4, counter 3 is enabled in counting mode and free running clock 7 is initialized. When controller 2 detects a change in the output of chain 4, i.e. the toggled bit is recognized, the controller turns off the counter by disabling the counter mode signal and the free running clock 7 is also disabled. At this time, controller 2 also sends an end sort signal to tester 6 indicating that sorting has been completed. For example, at reset all latches in scan chains 4 and 5 may include logical zeros. Then, controller 2 provides a logical one as the toggled input. Thus, when a logical one is encountered at the output of scan chain 5, the counter 3 and free running clock 7 are stopped and their values saved. In the scan mode, where begin sort is low and the scan mode of all the chains have been entered, the content of counter 3 may be scanned out (scan mode of counter 3 is set at this time). The counter may also be configured as a separate scan chain in and of itself or may be part of another chain. Thus, the value of counter 3 is scanned out and provided to tester 6.

With particular reference to FIG. 2, it can be seen that once the integrated circuit has stabilized, controller 2 will input a scan enable signal to the initial stage in flushable scan chain 4, such as the SI input to latch 40. During flush mode, clock A and clock B will be held high at a logical 1. Thus, the SI input to latch L1 (40) will be provided to latch L2 (41) and output to subsequent stage latch L1 (43) and so on. It should be noted that under normal operations the A clock and B clock will alternately input a logical 1 to latches L1 and L2, e.g. 40 and 41, such that data from the combinational logic is provided to the subsequent stages. As an example, from FIG. 2, it can be seen that the three stages 100, 101 and 102 will cause the toggled input to latch 40 to traverse six gates (latches 40 through 47). Then, once the latch L2, e.g. latch 47, of the final stage outputs the toggled input to controller 2 and the controller recognizes this input as the toggled bit, counter 3 and the free running clock are stopped.

As previously described, the counter value is provided by scanning to the tester 6 which also knows the amount of time which has elapsed based upon the free running clock 7 such that the speed at which the toggled input traveled through flushable scan chains 4 and 5 can be determined. That is, the counter value from counter 3 and the elapsed time period from free running clock 7 are used to obtain a parameter indicative of circuit speed in counts/second. Thus, the smaller the value of this parameter, the faster the chip. Therefore, the information at tester 6 can then be utilized to determine whether integrated circuit 1 operated at the designed maximum operating frequency or at a higher or lower speed. Chips 1 can then be sorted based upon this information and priced accordingly.

Although certain embodiments have been shown and described, it will be understood that many changes and modifications may be made therein without departing from the scope of the appended claims.

I claim:

1. A system for determining a frequency of an integrated circuit including a plurality of sequentially connected scan circuits, comprising:

control means for providing a test bit to a first one of said scan circuits, and for determining when said test bit is output by a last one of said scan circuits; and means for determining a time period for said test bit to traverse all of said scan circuits means for determining said frequency of said integrated circuit based on said time period.

2. A system according to claim 1 wherein said means for determining a time period comprises:

means for counting a plurality of events; and clock means for providing a time period associated with said plurality of events.

3. A system according to claim 2 wherein said control means comprises:

means for concurrently initializing said means for counting and said clock means when said test bit is provided to said first one of said scan circuits; and means for disabling said means for counting and said clock means when said test bit is output by said last one of said scan circuits.

4. A system according to claim 3 further comprising means for providing said counted plurality of events and said associated time period to a test apparatus.

5. A system according to claim 4 wherein said test appratus generates a parameter in accordance with said counted plurality of events and said associated time period.

6. A system according to claim 5 wherein said test apparatus compares said generated parameter to a design parameter for said plurality of sequentially connected scan circuits to determine the frequency of said integrated circuit.

7. A method of determining a frequency for an integrated circuit having a plurality of sequentially connected scan circuits, comprising the steps of:

providing a test bit to a first one of said scan circuits, and determining when said test bit is output by a last one of said scan circuits; and determining a time period for said test bit to traverse all of said scan circuits determining said frequency of said integrated circuit based on said time period.

8. A method according to claim 7 wherein said step of determining a time period comprises the steps of:

counting a plurality of events; and providing, by a clock, a time period associated with said plurality of events.

9. A method according to claim 8 further comprising the steps of:

concurrently initializing said steps of counting and providing a time period to begin when said test bit is provided to said first one of said scan circuits; and ceasing said plurality of events and disabling said said clock when said test bit is output by said last one of said scan circuits.

10. A method according to claim 9 further comprising the step of providing said counted plurality of events and said associated time period to a test apparatus.

11. A method according to claim 10 further comprising the step of generating, by said test appratus, a parameter in accordance with said counted plurality of events and said associated time period.

12. A method according to claim 11 further comprising the step of comparing, by said test apparatus, said generated parameter to a design parameter for said plurality of sequentially connected scan circuits; and determining the frequency of said integrated circuit based upon said comparison.

* * * * *